(12) United States Patent
Pei

(10) Patent No.: US 8,257,547 B2
(45) Date of Patent: Sep. 4, 2012

(54) SURFACE ACTIVATION DEVICE

(75) Inventor: Shao-Kai Pei, Tu-Cheng (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 337 days.

(21) Appl. No.: 12/790,882

(22) Filed: May 31, 2010

(65) Prior Publication Data
US 2011/0203736 A1 Aug. 25, 2011

(30) Foreign Application Priority Data

Feb. 24, 2010 (TW) .................................. 99105226

(51) Int. Cl.
*C23C 16/00* (2006.01)
*C23F 1/00* (2006.01)
*H01L 21/306* (2006.01)

(52) U.S. Cl. ......... 156/345.51; 156/345.52; 156/345.53; 156/345.54; 156/345.55; 156/345.23; 118/728; 118/729; 118/730

(58) Field of Classification Search .......... 156/345.51–345.55, 345.23; 118/728–730
See application file for complete search history.

(56) References Cited

U.S. PATENT DOCUMENTS

| | | | | | |
|---|---|---|---|---|---|
| 3,796,182 | A | * | 3/1974 | Rosler | 118/725 |
| 4,446,817 | A | * | 5/1984 | Crawley | 118/725 |
| 4,651,674 | A | * | 3/1987 | Hayashi et al. | 118/728 |
| 4,848,272 | A | * | 7/1989 | Ohmura et al. | 118/725 |
| 7,462,246 | B2 | * | 12/2008 | Hellwig | 118/728 |
| 2006/0231035 | A1 | * | 10/2006 | Hellwig | 118/728 |
| 2008/0305269 | A1 | * | 12/2008 | Sager et al. | 427/383.3 |

FOREIGN PATENT DOCUMENTS

JP 59-50092 * 3/1984

* cited by examiner

*Primary Examiner* — Rakesh Dhingra
(74) *Attorney, Agent, or Firm* — Altis Law Group, Inc.

(57) ABSTRACT

A surface activation device comprises a holding compartment, a nozzle support, and a sealing assembly. The holding compartment defines a receiving chamber and defining a plurality of recesses for holding workpieces therein. The nozzle support is rotatably received in the receiving chamber and comprises an outer barrel, an inner barrel is received in the outer barrel, and at least one ultraviolet (UV) lamp is embedded in the outer barrel. The outer barrel and the inner barrel cooperatively define a first chamber therebetween, and the inner barrel defines a second chamber therein. The sealing assembly seals the first chamber and the second chamber, and comprises at least one first inlet tube communicated with the first chamber and at least one second inlet tube communicated with the second chamber.

8 Claims, 3 Drawing Sheets

SURFACE ACTIVATION DEVICE

BACKGROUND

1. Technical Field

The present disclosure relates to activation devices and, particularly, to a surface activation device capable of simultaneously implementing different surface activations.

2. Description of Related Art

Many kinds of surface activating methods, such as chemical processing, plasma sputtering, and ultraviolet (UV)-irradiation, are utilized to activate the surfaces of work-pieces for obtaining desired surface characteristics. However, the workpieces generally need to be activated by different surface activation methods, and different surface activations are carried out by different special nozzle supports. Therefore, the work-pieces must be transported from one nozzle support to another, which is inconvenient and time-consuming.

Therefore, it is desirable to provide a surface activation device which can overcome the limitations described above.

DETAILED DESCRIPTION

Embodiments of the disclosure will now be described in detail, with reference to the accompanying drawings.

Figure 1:
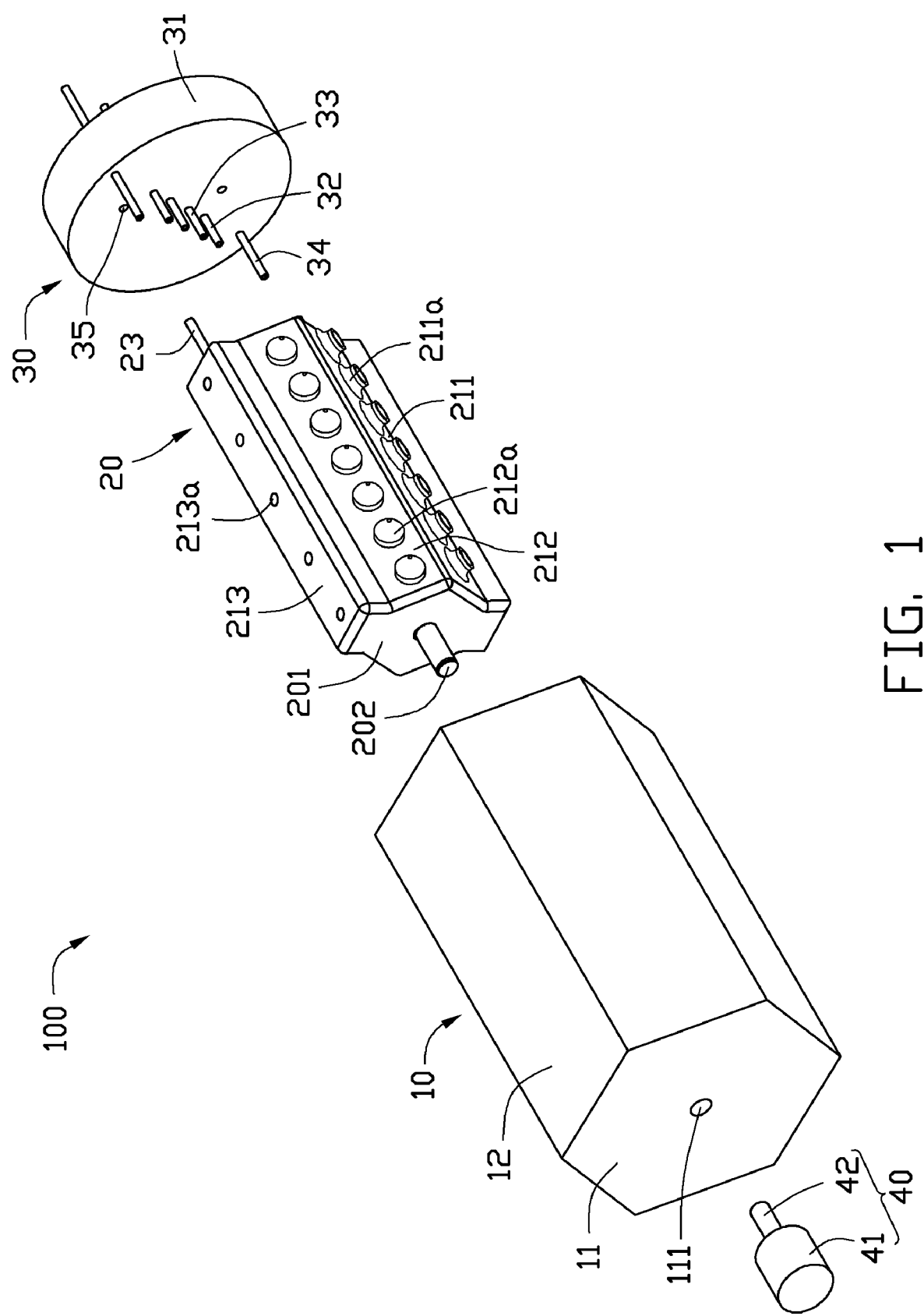
FIG. 1 is an isometric and exploded view of a surface activation device, according to an exemplary embodiment.
Figure 2:
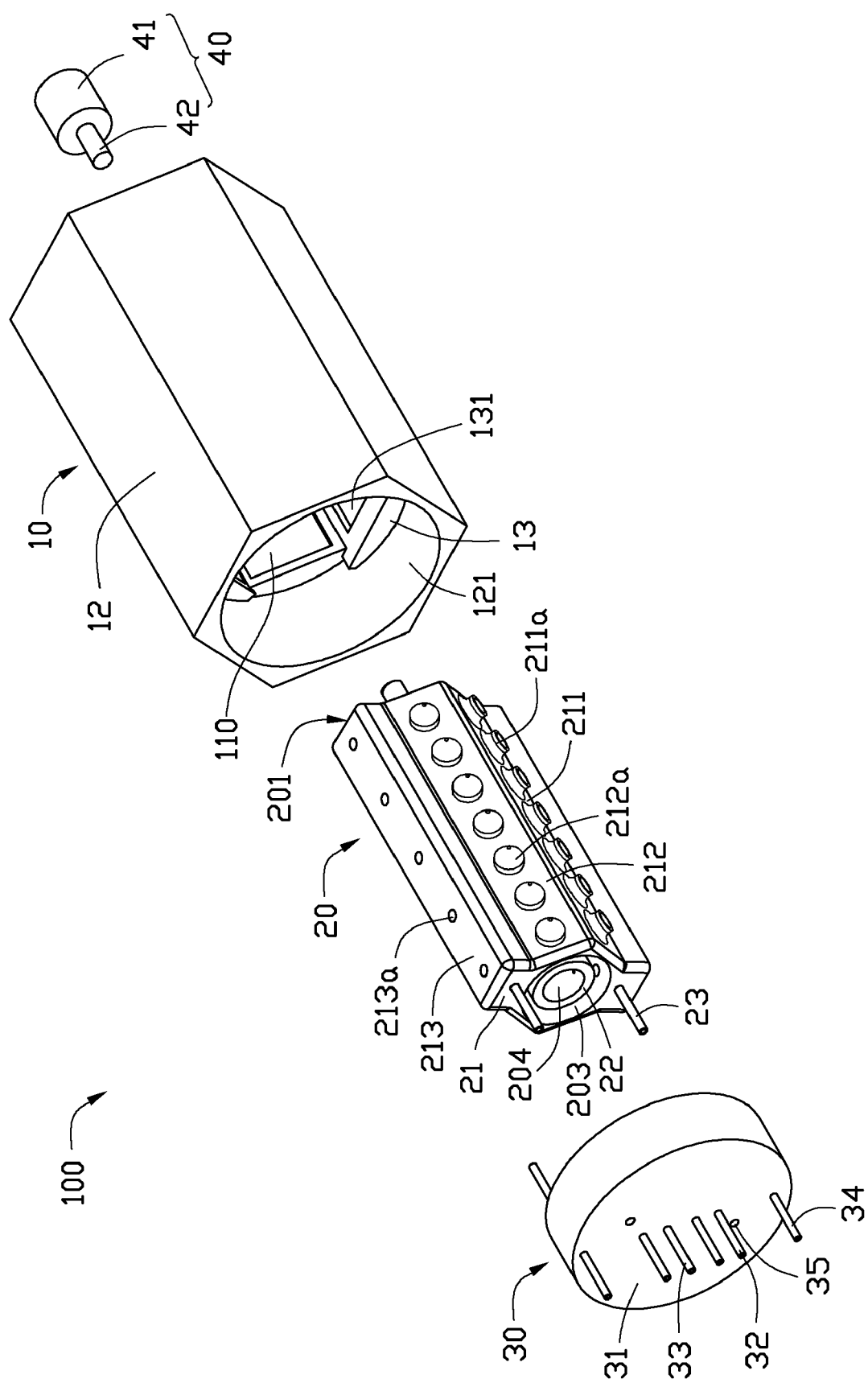
FIG. 2 is an inverted view of the surface activation device of FIG. 1.

Referring to FIGS. 1-2, a surface activation device 100, according to an exemplary embodiment, is configured for activating surfaces of work-pieces (not shown). The surface activation device 100 comprises a holding compartment 10, a nozzle support 20, a sealing assembly 30, and an actuator 40. The nozzle support 20 is sealed in a chamber formed by the holding compartment 10 and the sealing assembly 30, and the actuator 40 rotates the nozzle support 20.

The holding compartment 10 is generally a hexagonal chamber, and comprises a bottom plate 11 and six sidewalls 12 perpendicularly extending from the periphery of the bottom plate 11. The bottom plate 11 defines a shaft hole 111 at a center thereof. The sidewalls 12 cooperating with the bottom plate 11 form a receiving chamber 110 therebetween. The receiving chamber 110 is bounded by inner surfaces 121 of the sidewalls 12. The holding compartment 10 further comprises a number of holding plates 13 attached on the inner surfaces 121 respectively, and arranged along an axis direction of the holding compartment 10. Each holding plate 13 defines a number of recesses 131, facing inward of the holding compartment 10 and receiving a corresponding workpiece therein.

The configuration of the holding compartment 10 may be varied in other embodiments as needed. To reduce or increase the number of the inner surfaces 121 for holding less or more work-pieces, other shapes of holding compartment 10 different from the present exemplary embodiment can be easily designed correspondingly.

The nozzle support 20 comprises a lower plate 201, and a shaft 202 perpendicularly extending outward from a center of the lower plate 201. The nozzle support 20 is received in the receiving chamber 110 of the holding compartment 10, with the shaft 202 extending out of the shaft hole 111.

The nozzle support 20 further comprises an outer barrel 21, an inner barrel 22, and two UV lamps 23. The outer barrel 21 and the inner barrel 22 are mounted on the lower plate 201, and the inner barrel 22 is received in the outer barrel 21. The inner diameter of the outer barrel 21 is greater than the outer diameter of the inner barrel 22 thereby a first chamber 203 is formed between the outer barrel 21 and the inner barrel 22. The inner barrel 22 defines a second chamber 204 therein.

Figure 3:
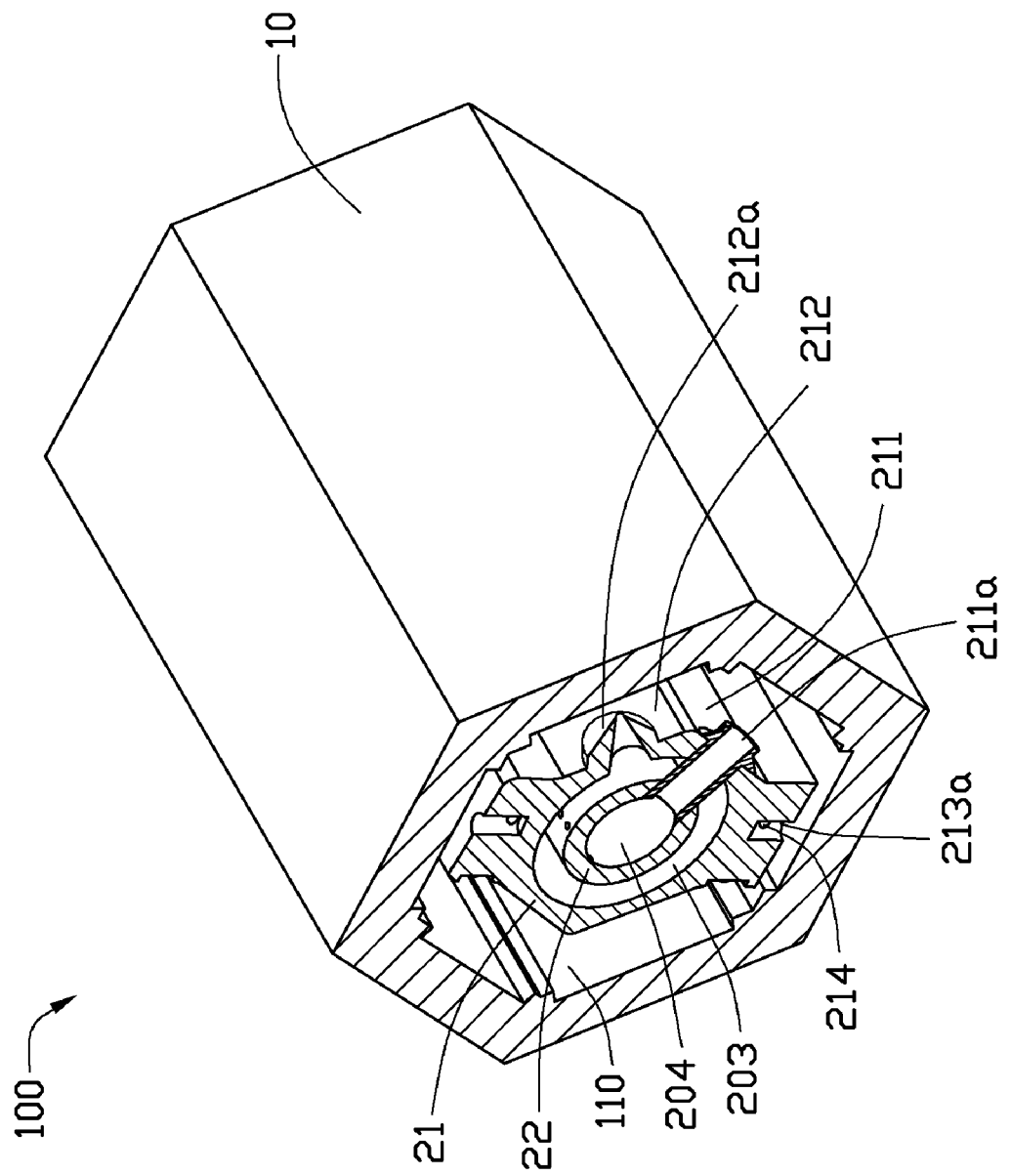
FIG. 3 is a cut-away view of the surface activation device of FIG. 1.

Further referring to FIG. 3, the outer barrel 21 is generally a hexagonal chamber and comprises two opposite first sidewalls 211, two opposite second sidewalls 212, and two opposite third sidewalls 213. The nozzle support 20 comprises a number of first nozzles 211a configured for use with a gas such as a noble, protruding outward from the first sidewalls 211 and extending to communicate with the second chamber 204, and a number of second nozzles 212a configured for use with a material such as plasma, protruding from the second sidewalls 212 and extending to communicate with the first chamber 203. The outer barrel 21 defines two tubular holes 214 on the third sidewalls 213, respectively, along a longitude direction thereof. The UV lamps 23 are partially received in the corresponding tubular holes 214 respectively. Each of the third sidewalls 213 defines a number of light emitting holes 213a communicated with the tubular holes 214.

The sealing assembly 30 comprises a cover plate 31, two first inlet tubes 32, two second inlet tubes 33, and two outlet tubes 34. The cover plate 31 is a circular plate and defines a number of through holes 35 running therethrough. The first inlet tubes 32, the second inlet tubes 33, and the outlet tubes 34 extend through the corresponding through holes 35. The first inlet tubes 32 are located between the outlet tubes 34, and the second inlet tubes 33 are located between the first inlet tubes 32.

The actuator 40 comprises a stator 41 and a rotor 42 extending outward from the center of the stator 41. The rotor 42 is connected to the shaft 202 to rotate the nozzle support 20.

In assembly, the cover plate 31 is rotatably installed into the receiving chamber 110. One end of the UV lamps 23 run through the through holes 35. The first chamber 203 and the second chamber 204 of the nozzle support 20 are sealed by the cover plate 31. The first inlet tubes 32 communicate with the first chamber 203 for conducting active plasma into the first chamber 203. The second inlet tubes 33 communicate with the second chamber 204 for conducting noble gas, such as argon and nitrogen, into the second chamber 204. The outlet tubes 34 communicate with the receiving chamber 110 for releasing excess gas into a waste gas collection device (not shown).

The cover plate 31 can be fixed on the nozzle support 20 via screws or other known technology.

In use, initially, a number of workpieces are loaded into the corresponding recesses 131. After the receiving chamber 110 is sealed by the sealing assembly 30, the receiving chamber 110 is vacuumed via the outlet tubes 34. Then, the actuator 40 drives the nozzle support 20 to rotate, and the sealing assembly 30 rotates with the nozzle support 20. Then a material, such as active plasma is filled into the first chamber 203 via the first inlet tubes 32, meanwhile, a gas, such as noble gas is filled into the second chamber 204 via the second inlet tubes 33, and the UV lamps 23 is lighted. The active plasma sputters from the second nozzles 212a and is bombarded by the noble gas jetted from the first nozzles 211a, thereby ionizing the active plasma. UV light rays are emitted from the UV lamps 23 through the light emitting holes 213a. As the nozzle support 20 rotates, the workpieces loaded on the holding compartment 10 are activated by the ionized plasma and the UV light rays simultaneously.

It will be understood that particular embodiments and methods are shown and described by way of illustration only. The principles and the features of the present disclosure may be employed in various and numerous embodiments thereof without departing from the scope of the disclosure as claimed. The above-described embodiments illustrate the scope of the disclosure but do not restrict the scope of the disclosure.

What is claimed is:

1. A surface activation device, comprising:
a holding compartment comprising a plurality of inner surfaces cooperatively defining a receiving chamber, and a plurality of holding plates disposed on the inner surfaces respectively, each holding plate defining a plurality of recesses for loading work-pieces therein;
a nozzle support rotatably received in the receiving chamber and comprising an outer barrel, an inner barrel received in the outer barrel, and at least one ultraviolet (UV) lamp embedded in the outer barrel; the outer barrel and the inner barrel cooperatively defining a first chamber there between, the inner barrel having a second chamber therein;
the nozzle support further comprising a plurality of first nozzles extending to and communicating with the second chamber and a plurality of second nozzles extending to and communicating with the first chamber; the nozzle support defining a plurality of light emitting holes for emitting light from the at least one UV lamp towards the workpieces; and
a sealing assembly sealing the first chamber and the second chamber, and comprising at least one first inlet tube communicated with the first chamber and at least one second inlet tube communicated with the second chamber.

2. The surface activation device in claim 1, wherein the at least one first inlet tube is configured for conducting an active plasma into the first chamber, and the at least one second inlet tube is configured for conducting a noble gas into the second chamber.

3. The surface activation device in claim 1, wherein the holding compartment comprises a bottom plate defining a shaft hole at a center thereof; the nozzle support comprises a lower plate, and a shaft extending perpendicularly through a center of the lower plate, the shaft extends out of the shaft hole.

4. The surface activation device in claim 3, further comprising an actuator, wherein the actuator comprises a stator and a rotor interconnected with the shaft.

5. The surface activation device in claim 1, wherein the outer barrel comprises two opposite first sidewalls, two opposite second sidewalls, and two opposite third sidewalls; the first nozzles protrude outwardly from the first sidewalls; the second nozzles protrude outwardly from the second sidewalls; and the light emitting holes are defined in the third sidewalls.

6. The surface activation device in claim 5, wherein the outer barrel defines two tubular holes on the third sidewalls along a longitude direction thereof, and the tubular holes communicate with the light emitting holes; the at least one UV lamps is partially received in the corresponding tubular holes.

7. The surface activation device in claim 1, wherein the sealing assembly further comprises a cover plate and at least one outlet tubes, the sealing assembly defines a plurality of through holes running through two end surfaces thereof; the first inlet tubes, the second inlet tubes, and the outlet tubes are all received in the through holes respectively.

8. The surface activation device in claim 7, wherein the cover plate is rotatably installed into the receiving chamber, and the at least one UV lamp each passes through one of through holes.

\* \* \* \* \*